(12) United States Patent (10) Patent No.: US 7,868,625 B2
Burt et al. (45) Date of Patent: Jan. 11, 2011

(54) SLOT INTERPOSER PROBE

(75) Inventors: Devin G. Burt, Hillsboro, OR (US);
Joshua J. O'Brien, Hillsboro, OR (US);
David W. Koch, Portland, OR (US);
Roxann R. Jones, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 246 days.

(21) Appl. No.: 12/121,765

(22) Filed: May 15, 2008

(65) Prior Publication Data

US 2009/0284268 A1 Nov. 19, 2009

(51) Int. Cl.
*G01R 31/08* (2006.01)
(52) U.S. Cl. ........................ 324/555; 324/538
(58) Field of Classification Search ................ 324/538, 324/555, 158.1, 73.1; 174/261
See application file for complete search history.

(56) References Cited

U.S. PATENT DOCUMENTS 3,281,627 A * 10/1966 Fetterolf et al. ............. 174/261

* cited by examiner

*Primary Examiner*—Vincent Q Nguyen
(74) *Attorney, Agent, or Firm*—Bennet K. Langlotz; Thomas F. Lenihan (57) ABSTRACT

The slot interposer probe consists of a board with a male edge connector and a female edge connector connected to its opposed edges and circuitry electrically connecting the male edge connector to the female edge connector. The female edge connector may be a straddle-mount connector. The board may have an inner layer sandwiched between two outer layers. There may be a probe having a high-speed buffer connected to a plurality of capacitors, isolation resistors, and vias that intercepts signals carried by transmission lines on the inner layer. The vias may have a length equal to the inner layer's width. The high-speed buffer receives intercepted signals from the vias, copies and amplifies the signals, and drives them through coaxial cables to an acquisition module. The invention also includes a method of intercepting signals between a first electrical device and a second electrical device.

22 Claims, 6 Drawing Sheets

SLOT INTERPOSER PROBE

FIELD OF THE INVENTION

The present invention relates to a slot interposer probe for use in connection with intercepting and transferring signals in a computer or other electronic device. The slot interposer probe has particular utility in connection with intercepting signals between an expansion card and a computer's system board and transferring them to a logic analyzer module for analysis.

BACKGROUND OF THE INVENTION

Slot interposer probes are desirable for intercepting signals between an expansion card and a computer's system board and transferring them to a logic analyzer module for analysis. An expansion card is a printed circuit board that is inserted into an expansion slot of a computer's system board. Expansion cards add additional functionality to a computer system. One edge of the expansion card holds the contacts (the edge connector) that fit exactly into the slot. They establish the electrical contact between the electronics (mostly integrated circuits) on the card and on the motherboard.

Demand for more sophisticated computer graphics has led to higher performance video cards, a type of expansion card, that require increased data transfer rates. Presently, PCI Express is the most common interface for graphics cards because of its high-bandwidth data transfer capabilities. Analyzing signals between expansion cards that use PCI Express and system boards to determine what the signals are doing at a logical level is an important part of validating or troubleshooting a computer design. Signal analysis between expansion cards and system boards can also be useful in a service and repair environment to diagnose malfunctions.

Figure 1:
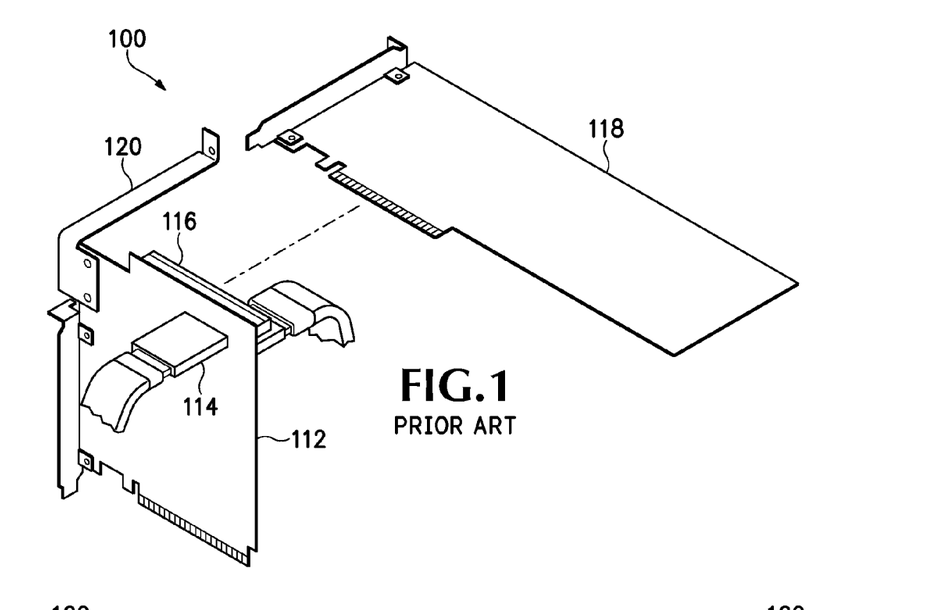
FIG. 1 is a top perspective view of a prior art slot interposer.

The use of slot interposers is known in the prior art. For example, a previous generation slot interposer design 100, which is depicted in FIG. 1, has two mid-bus probe heads 114 attached to a slot board 112. One end of the slot board 112 is inserted into a PCI Express slot in a system board when in use. The other end of the slot board 112 has a PCI Express connector 116 protruding vertically from its upper surface. The PCI Express expansion card 118 to be tested is inserted into the PCI Express connector 116. An optional support bracket 120 secures the PCI Express expansion card 118 to the PCI Express connector 116.

Figures 2A, 2B:
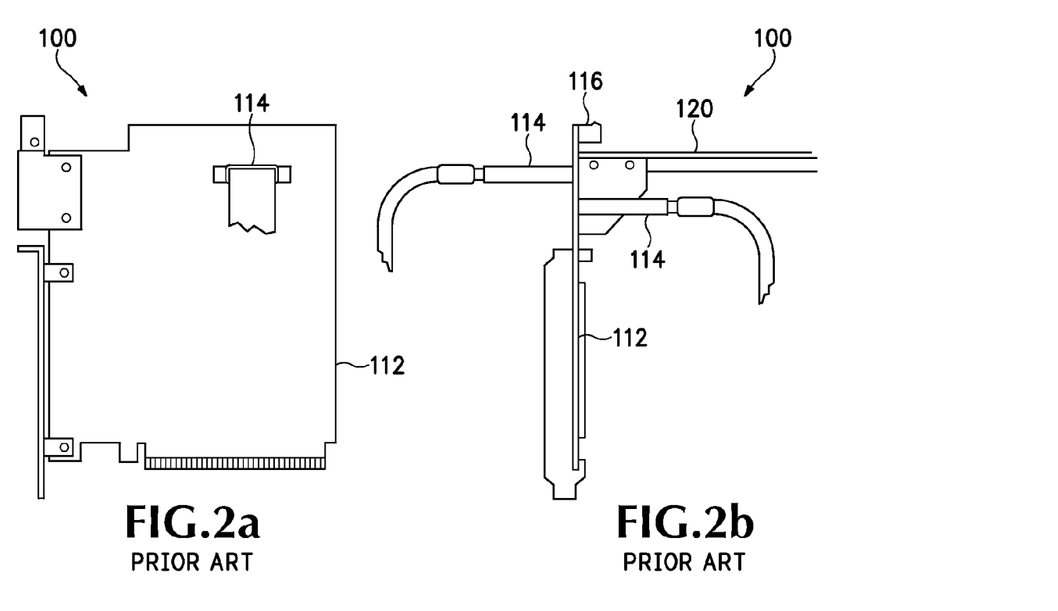
FIG. 2a is a top view of the prior art slot interposer.
FIG. 2b is an end view of the prior art slot interposer.

The prior art slot interposer 100 has a number of disadvantages that have become apparent as PCI Express and graphics card technology has advanced. As is shown in FIGS. 2a and 2b, the prior art slot interposer 100 occupies a larger volume of space than does a conventional PCI Express graphics card, which presents a problem with modern computer configurations. The mid-bus probes 114, each of which is about 89 mm in length, make the slot interposer 100 about 178 mm wider than a conventional PCI Express expansion card 118 even before an expansion card 118 is installed. Therefore, the slot interposer 100 has the potential to obstruct other slots on the system board. This prevents expansion cards from being installed adjacent to the slot interposer 100 during testing.

Similarly, the requirement for the expansion card 118 to be plugged in perpendicularly to the slot interposer 100 also has the potential to prevent installation of adjacent cards when the slot interposer 100 is present. When an expansion card 118 is plugged into the slot interposer 100, the slot interposer 100 is nearly 200 mm wide. As graphics card manufacturers have developed technologies that allow up to four graphics cards to run in parallel in adjacent PCI Express slots for increased performance, significant space constraints above the system board exist that prevent the use of the prior art slot interposer 100 for acquiring signals from such system configurations.

Furthermore, the data transfer rates of PCI Express links have increased and are expected to further increase in the future. The version of PCI Express in most common use, PCI Express 1.1 x16, transfers data at 2.5 GT/s in each direction. PCI Express 2.0, which is already appearing in newer systems, doubles this transfer rate. At speeds exceeding 5 GT/s, undesirable capacitive loading because of the length of the mid-bus probes 114 can occur that slows down high-speed signals and/or causes signal reflections.

Therefore, a need exists for a new and improved slot interposer probe that can be used for intercepting signals between an expansion card and a computer's system board and transferring them to a logic analyzer module for analysis. In this regard, the various embodiments of the present invention substantially fulfill at least some of these needs. In this respect, the slot interposer probe according to the present invention substantially departs from the conventional concepts and designs of the prior art, and in doing so provides an apparatus primarily developed for the purpose of intercepting signals between an expansion card and a computer's system board and transferring them to a logic analyzer module for analysis.

SUMMARY OF THE INVENTION

The present invention provides an improved slot interposer probe, and overcomes the above-mentioned disadvantages and drawbacks of the prior art. As such, the general purpose of the present invention, which will be described subsequently in greater detail, is to provide an improved slot interposer probe that has all the advantages of the prior art mentioned above.

To attain this, the preferred embodiment of the present invention essentially comprises a board with a male edge connector and a female edge connector connected to its opposed edges and circuitry electrically connecting the male edge connector to the female edge connector. The female edge connector may be a straddle-mount connector. The board may have an inner layer sandwiched between two outer layers. There may be a probe having a high-speed buffer connected to a plurality of capacitors, isolation resistors, and vias that intercepts signals carried by transmission lines on the inner layer. The via may have a length equal to the inner layer's width. The high-speed buffer receives intercepted signals from the vias, copies and amplifies the signals, and drives them through coaxial cables to an acquisition module. The invention also includes a method of intercepting signals between a first electrical device and a second electrical device. There are, of course, additional features of the invention that will be described hereinafter and which will form the subject matter of the claims attached.

There has thus been outlined, rather broadly, the more important features of the invention in order that the detailed description thereof that follows may be better understood and in order that the present contribution to the art may be better appreciated.

BRIEF DESCRIPTION OF THE DRAWINGS

The same reference numerals refer to the same parts throughout the various figures.

DESCRIPTION OF THE CURRENT EMBODIMENT

A preferred embodiment of the apparatus for a test and measurement instrument of the present invention is shown and generally designated by the reference numeral 10.

The principles of the present invention are applicable to a variety of computer hardware and software configurations. The term "computer hardware" or "hardware," as used herein, refers to any machine or apparatus that is capable of accepting, performing logic operations on, storing, or displaying data, and includes without limitation processors and memory; the term "computer software" or "software," refers to any set of instructions operable to cause computer hardware to perform an operation. A "computer," as that term is used herein, includes without limitation any useful combination of hardware and software, and a "computer program" or "program" includes without limitation any software operable to cause computer hardware to accept, perform logic operations on, store, or display data.

Figure 3:
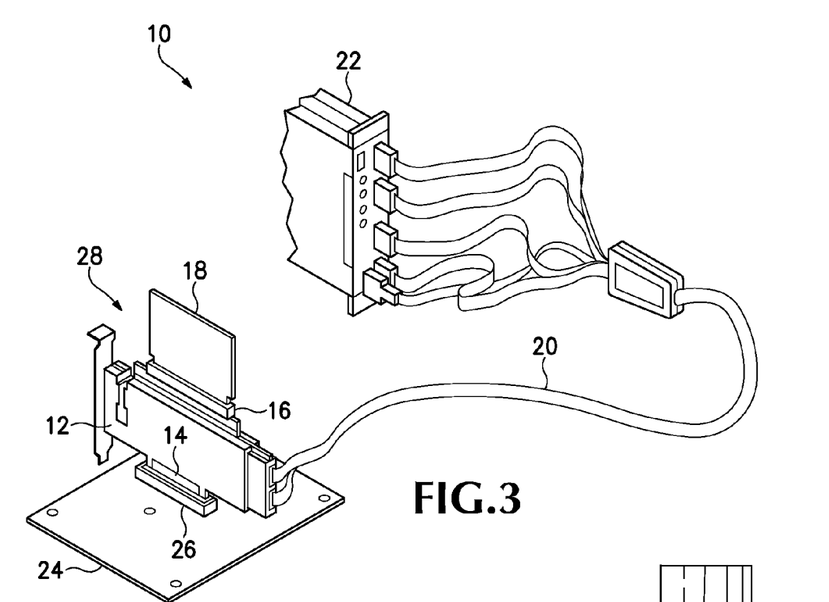
FIG. 3 is a top perspective view of the current embodiment of the slot interposer probe constructed in accordance with the principles of the present invention.

FIG. 3 illustrates improved slot interposer probe 10 of the present invention. More particularly, slot interposer probe 10 is depicted in use with PCI Express male edge connector 14 inserted into the PCI Express slot 26 of system board 24. System board 24 is installed in computer 28. A straddle-mount PCI Express female connector 16 is connected to the slot interposer probe 10 opposite and coplanar with the PCI Express male edge connector 14. The expansion card 18 undergoing test is connected to the straddle-mount PCI Express female connector 16. Coaxial cables 20 extend from one end of the slot interposer probe 10 to transfer signals from the slot interposer probe 10 to an acquisition module 22 for storage and analysis. A protective housing 12 encloses the slot interposer probe 10. Please note that PCI Express slot 26, system board 24, and computer 28 are not necessarily part of the current invention, but may have alternative substitutes in different applications of the principles of the invention.

Figure 4A:
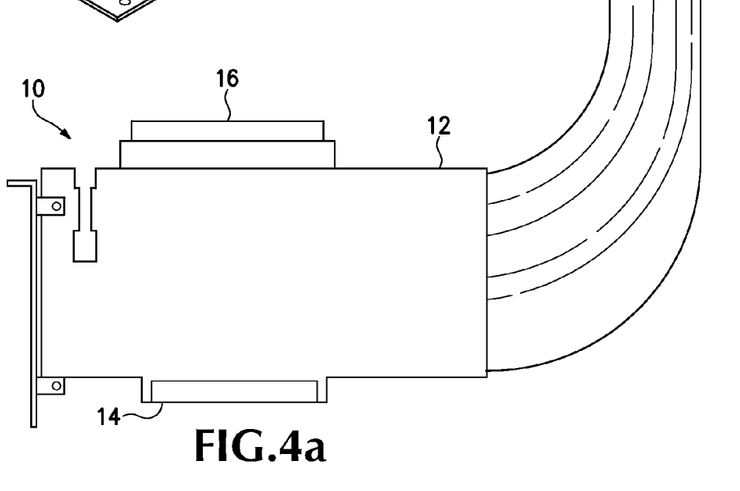
FIG. 4a is a frontview of the current embodiment of the slot interposer probe constructed in accordance with the principles of the present invention.
Figure 4B:
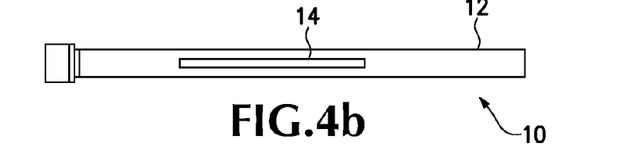
FIG. 4b is a top view of the current embodiment of the slot interposer probe constructed in accordance with the principles of the present invention.

As is shown in FIGS. 4a and 4b, the slot interposer probe 10 occupies a much smaller volume than does the prior art slot interposer 100. The slot interposer probe 10 is only about 15.9 mm wide compared to the nearly 200 mm wide prior art slot interposer 100 with a graphics card 118 installed. As a result, the slot interposer probe 10 does not block adjacent slots on the system board 24, which enables adjacent expansion cards to be present while the slot interposer probe 10 is in use.

Figure 5:
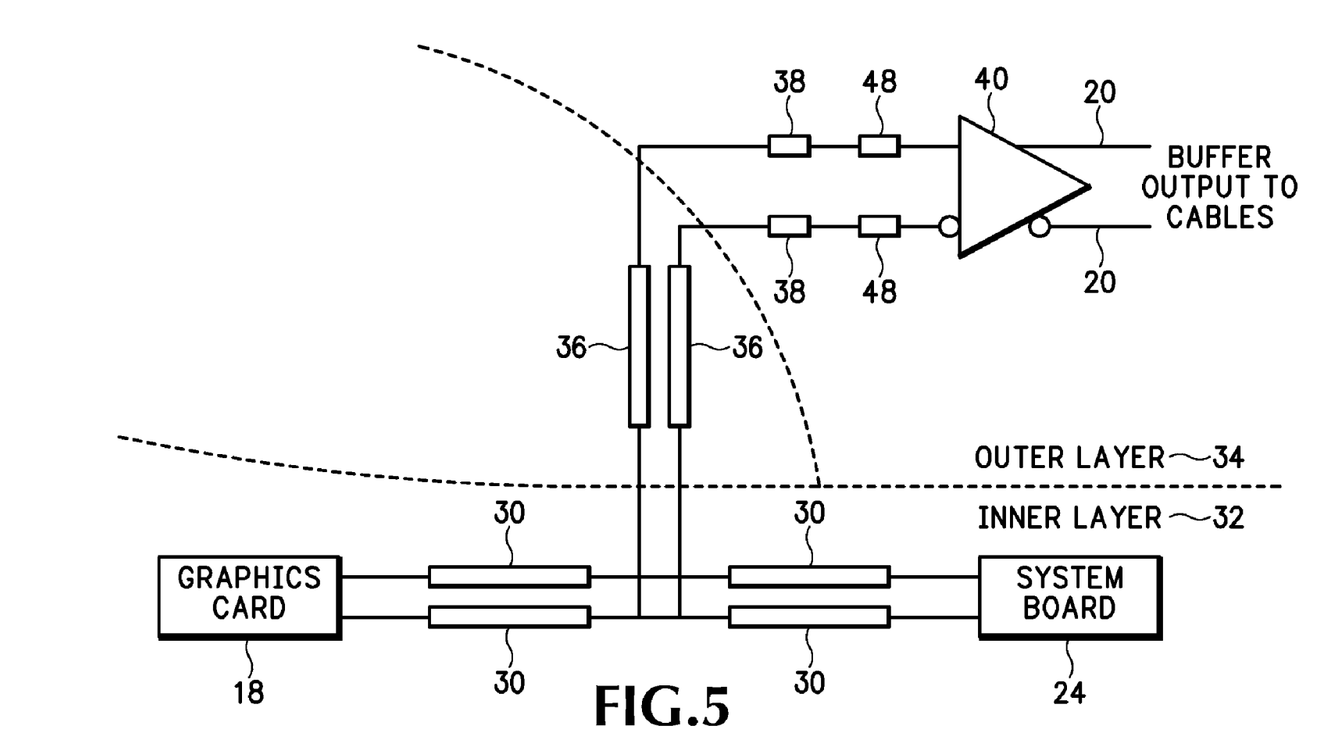
FIG. 5 is a circuit diagram of the current embodiment of the slot interposer probe constructed in accordance with the principles of the present invention.

FIG. 5 is a circuit diagram illustrating the electrical signal paths of the slot interposer probe 10. In a preferred embodiment, the slot interposer probe 10 has three separate boards that are fabricated and laminated together in a sequential laminated stack-up process to form the complete raw board. The complete raw board has an inner layer 32 sandwiched between two outer layers 34 (shown in FIG. 7). Transmission lines 30 form a signal layer on the inner layer 32. When the slot interposer probe 10 is in use, each PCI Express lane's signals between the expansion card 18 and the system board 24 pass through the slot interposer probe 10 on transmission lines 30 with minimal interference. Each transmission line 30 is also connected through a higher impedance path (vias 36 with capacitors 48 and isolation resistors 38) through one of the outer layers 34 to a high-speed buffer 40. The high-speed buffer 40 copies the intercepted signals, amplifies the signal copies, and drives the amplified signal copies through the coaxial cables 20 to the acquisition module 22.

Figure 6:
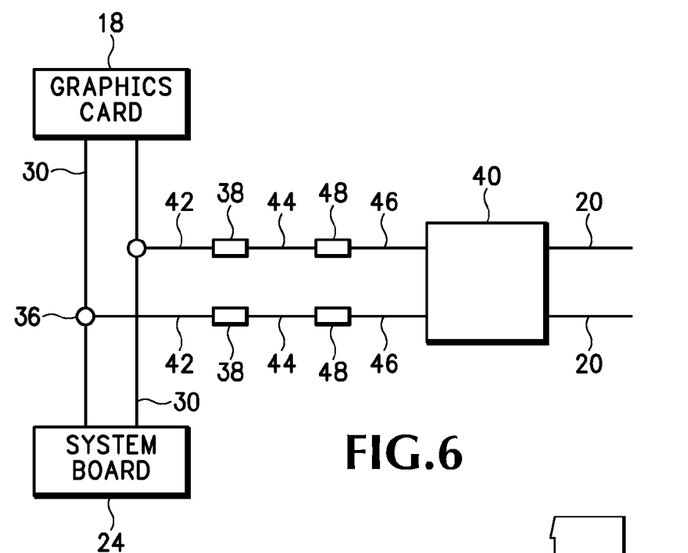
FIG. 6 is an enlarged side view of the current embodiment of the slot interposer probe configured for single channel data collection.

FIG. 6 illustrates an enlarged side view of the slot interposer probe 10 configured for single channel data collection. Vias 36, capacitors 48, and isolation resistors 38 connect the high-speed buffer 40 to the transmission lines 30 while isolating the signals from the high-speed buffer 40 to prevent interference with signal transmission between the expansion card 18 and the system board 24 over the transmission lines 30.

Figure 7:
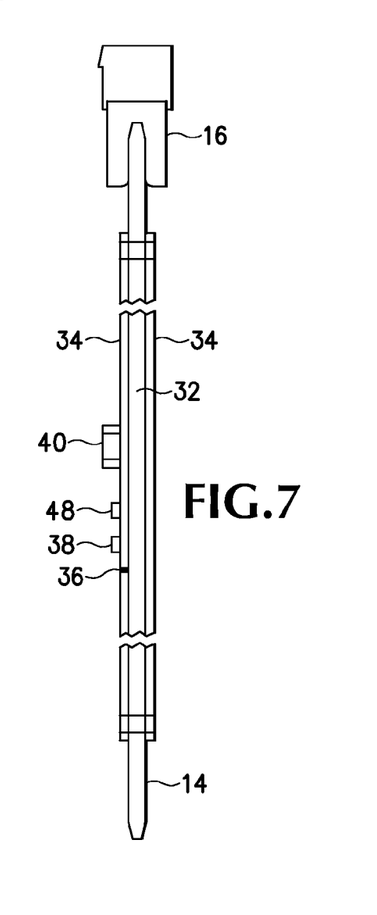
FIG. 7 is an end sectional view of the current embodiment of the slot interposer probe constructed in accordance with the principles of the present invention.
Figure 8:
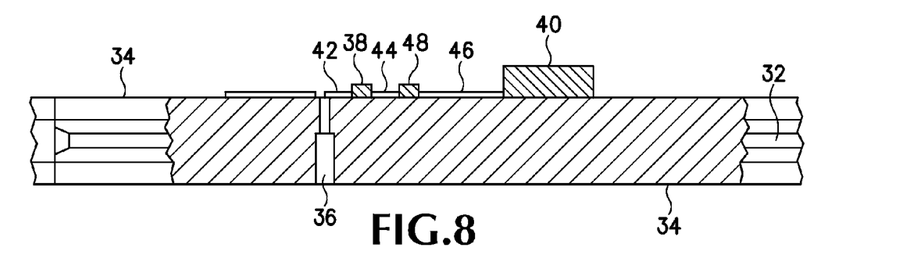
FIG. 8 is an enlarged end sectional view of the current embodiment of the slot interposer probe constructed in accordance with the principles of the present invention.

FIG. 7 illustrates an end sectional view of the slot interposer probe 10, and FIG. 8 illustrates an enlarged end sectional view of the slot interposer probe 10. A first signal trace 42 connects one end of the via 36 to an isolation resistor 38. The isolation resistor 38 is connected to a capacitor 48 by a second signal trace 44 for AC coupling to the signal. A third signal trace 46 connects the high-speed buffer 40 to the capacitor 48. The portion of the first signal trace 42 inserted into the outer layer 34 has a length defined by the width of the outer layer 34, which is about 26 mils (0.026 inch) in the current embodiment. However, an outer layer 34 width of about 12 mils (0.012 inch) could easily be achieved. By using such a short probe, the risk of creating capacitive loading problems, even at data transmission rates of 5 GT/s, is eliminated. Capacitance increases approximately linearly with probe length. The portion of the first signal trace 42 attached to the exterior of the outer layer 34 is about 15 mils (0.015 inch) in the current embodiment.

Figure 9:
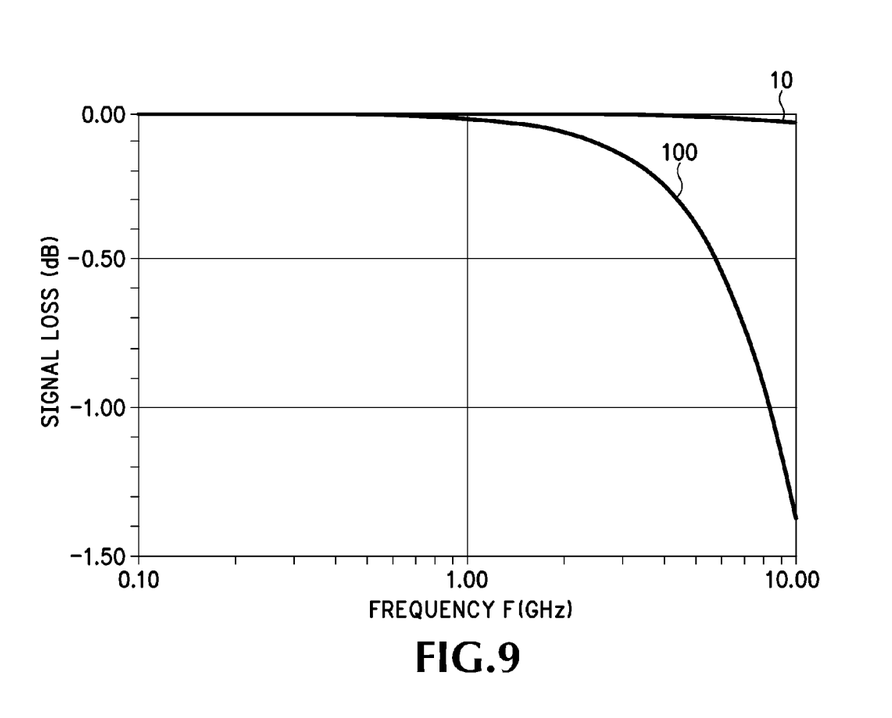
FIG. 9 is a graph depicting the signal loss experienced using the present invention and using a prior art slot interposer.

As is illustrated in FIG. 9, much less signal loss (measured in dB) occurs with the present invention at higher data transfer rates compared to the prior art slot interposer design 100, which had a probe length of approximately 125 mils (0.125 inch). At speeds exceeding 5 GB/s, the signal loss that occurs with the prior art slot interposer design 100 becomes very significant.

Furthermore, by placing the probe circuitry on the slot interposer probe 10 instead of using a "dumb" interposer with separate mid-bus probes 114 as in the prior art slot interposer 100, the volume of the slot interposer probe 10 is considerably reduced. These innovations, when combined with the use of the straddle-mount PCI Express connector 16 so an attached expansion card 18 rises vertically from the slot interposer probe 10's edge, permit adjacent expansion cards to be installed when the slot interposer probe 10 is in use. Testing a computer with all of its expansion cards installed simultaneously is essential for accurately validating the computer's design and troubleshooting malfunctions.

Figure 10:
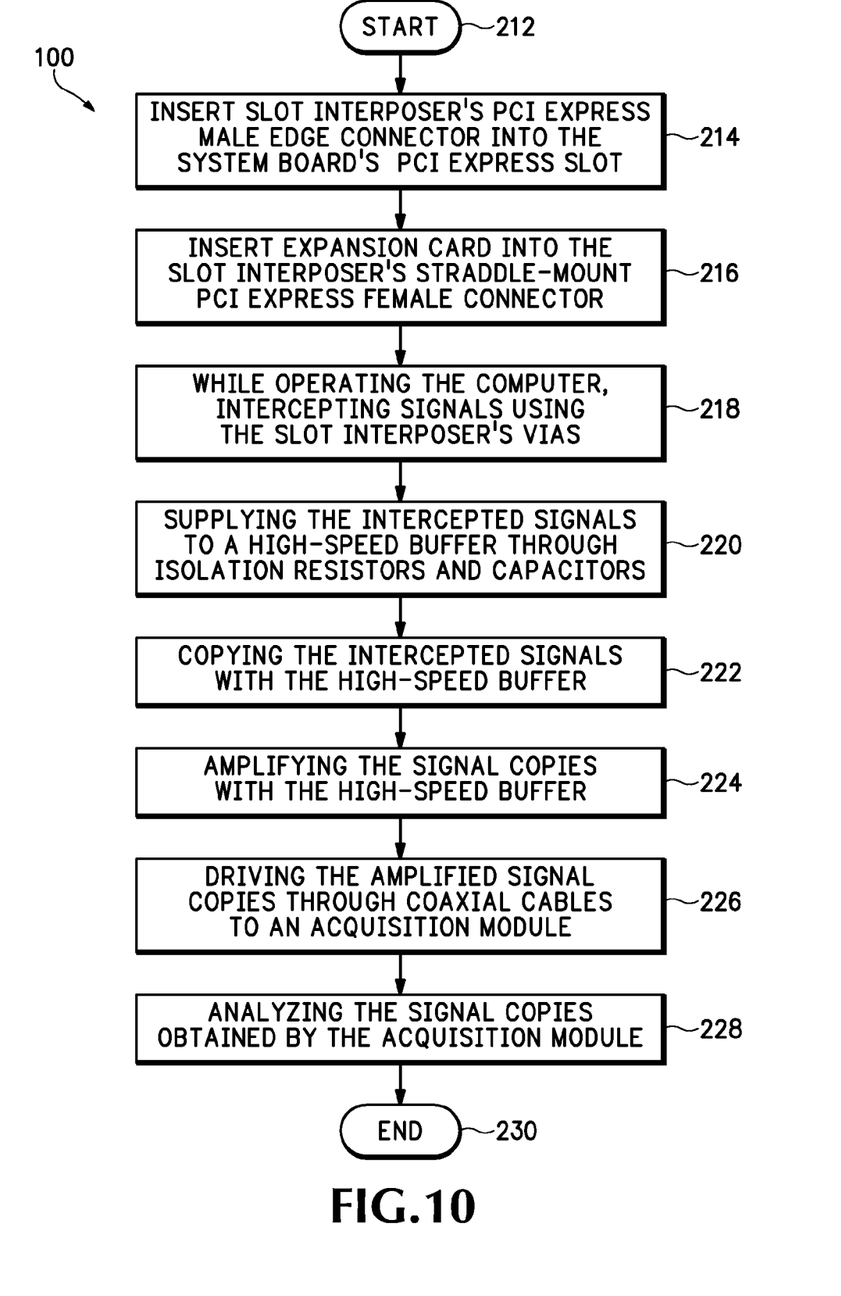
FIG. 10 is a flowchart view of the method of intercepting signals between a first electrical device and a second electrical device of the present invention.

FIG. 10 illustrates a method of intercepting signals between a first electrical device and a second electrical device (200). The method begins (212) when the PCI Express male edge connector 14 of the slot interposer probe 10 is inserted into the PCI Express slot 26 in the system board 24 (214). The expansion card 18 to be monitored is then inserted then into the straddle-mount PCI Express female connector 16 (216). As the computer 28 is operated, signals passing through transmission lines 30 are intercepted by vias 36 in the slot interposer probe 10 (218) and supplied to high-speed buffer 40 through isolation resistors 38 and capacitors 48 (220). High-speed buffer 40 copies the intercepted signals (222), amplifies the signal copies (224), and drives the amplified signal copies through coaxial cables 20 to acquisition module 22 (226). Acquisition module 22 makes the signal copies available to a user for analysis (228), and then the method terminates (230).

While current embodiments of the slot interposer probe have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitable outer layer width and corresponding via length may be used instead of the 12 mils (0.012 inch) described. And although intercepting signals between a graphics card and a computer's system board and transferring them to a logic analyzer module for analysis has been described, it should be appreciated that the slot interposer probe herein described is also suitable for intercepting signals between any type of expansion card and a system board.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A slot interposer probe for connection between a first electrical device and a second electrical device comprising:
   a board having opposed edges; a male edge connector attached to one of the board's opposed edges; a female edge connector attached to another of the boards opposed edges; circuitry electrically connecting the male edge connector to the female edge connector;
   the circuitry comprising a plurality of signal paths;
   a plurality of test paths, each connected to an intermediate portion of each of the signal paths at a junction; and
   each test path including an electrical component adjacent to the junction, wherein the electrical component is a resistor.

2. The slot interposer probe for connection between a first electrical device and a second electrical device as defined in claim 1, wherein the signal path is on a plane defined by the board, and wherein a second board overlays the board and supports the electrical component adjacent to a via extending the thickness of the second board, the via connecting the resistor to the signal path, such that the length of the portion of the test path between the signal path and the resistor is limited, based on the thickness of the second board.

3. The slot interposer probe for connection between a first electrical device and a second electrical device as defined in claim 2, wherein the thickness of the second board is less than or equal to 26 mils (0.026 inch).

4. The slot interposer probe for connection between a first electrical device and a second electrical device as defined in claim 1, wherein the female edge connector is a straddle-mount connector.

5. The slot interposer probe for connection between a first electrical device and a second electrical device as defined in claim 1, wherein the board comprises an inner layer having an inner layer width and an outer layer having an outer layer width.

6. The slot interposer probe for connection between a first electrical device and a second electrical device as defined in claim 5, wherein the circuitry comprises:
   a signal layer on the inner layer; and
   a probe electrically connected to the signal layer and passing through the outer layer.

7. The slot interposer probe for connection between a first electrical device and a second electrical device as defined in claim 6, wherein the signal layer comprises a plurality of transmission lines.

8. The slot interposer probe for connection between a first electrical device and a second electrical device as defined in claim 7, wherein the probe comprises:
   a plurality of vias having opposed ends, each of the vias having one of its opposed ends electrically connected to one of the transmission lines;
   a plurality of isolation resistors having opposed ends, each of the vias having the other of its opposed ends electrically connected to one of the opposed ends of the isolation resistors;
   a plurality of capacitors having opposed ends, each of the isolation resistors having the other of its opposed ends electrically connected to one of the opposed ends of the capacitors; and
   a high-speed buffer electrically connected to the other of the opposed ends of the capacitors.

9. The slot interposer probe for connection between a first electrical device and a second electrical device as defined in claim 8, wherein the probe further comprises:
   a plurality of coaxial cables having opposed ends, one of the opposed ends electrically connected to the high-speed buffer; and
   an acquisition module electrically connected to the other of the opposed ends of the coaxial cables.

10. The slot interposer probe for connection between a first electrical device and a second electrical device as defined in claim 8, wherein the high-speed buffer receives intercepted signals from the vias, copies the intercepted signals, amplifies the signal copies, and drives the amplified signal copies through the coaxial cables to the acquisition module.

11. The slot interposer probe for connection between a first electrical device and a second electrical device as defined in claim 6, wherein the probe has a higher impedance than the signal layer.

12. The slot interposer probe for connection between a first electrical device and a second electrical device as defined in claim 1, further comprising a housing enclosing the board and the circuitry.

13. The slot interposer probe for connection between a first electrical device and a second electrical device as defined in claim 1, wherein the male edge connector and the female edge connector are PCI Express connectors.

14. The slot interposer probe for connection between a first electrical device and a second electrical device as defined in claim 1, wherein the male edge connector and the female edge connector are coplanar.

15. An electrical test connector for connection between a first electrical device and a second electrical device each having a device connector, the device connectors operable to connect to each other to provide a functional interface between the first and second devices, the test connector comprising:

a body having a first connector and a second connector, the first connector being operable to connect to the device connector of the first device, and the second connector being operable to connect to the device connector of the second device; the first connector and the second connector each having a plurality of contacts; the body including a plurality of electrical paths each extending between a respective contact of the first connector and the second connector;

a plurality of test paths, each connected to an intermediate portion of each of the signal paths at a junction; and each test path including an electrical component adjacent to the junction, wherein the electrical component is a resistor.

16. The test connector of claim 15, wherein the signal path is on a plane defined by the board, and wherein a second board overlays the board and supports the electrical component adjacent to a via extending the thickness of the second board, the via connecting the resistor to the signal path, such that the length of the portion of the test path between the signal path and the resistor is limited, based on the thickness of the second board.

17. The test connector of claim 16, wherein the thickness of the second board is less than or equal to 26 mils (0.026 inch).

18. The test connector of claim 16, further comprising a high-speed buffer connected by the resistor to the via.

19. A method of intercepting signals between a first electrical device and a second electrical device comprising the steps of:

providing the test connector of claim 16;
connecting the test connector to the first device;
connecting the second device to the test connector; and
intercepting signals between the first device and the second device using the test paths.

20. The method of claim 19 wherein the test connector is connected to the first device by inserting the test connector's first connector into the first device's device connector.

21. The method of claim 19, wherein the second device is connected to the test connector by inserting the second device's device connector into the test connector's second connector.

22. The method of claim 21, wherein the test connector's second connector is a straddle-mount connector.

* * * * *